(12) United States Patent
Alami et al.

(10) Patent No.: US 9,551,066 B2
(45) Date of Patent: Jan. 24, 2017

(54) HIGH-POWER PULSED MAGNETRON SPUTTERING PROCESS AS WELL AS A HIGH-POWER ELECTRICAL ENERGY SOURCE

(75) Inventors: Jones Alami, Bergisch Gladbach (DE); Georg Erkens, Aachen (DE); Jürgen Müller, Olpe (DE); Jörg Vetter, Bergisch Gladbach (DE)

(73) Assignee: OERLIKON SURFACE SOLUTIONS AG, PFAEFFIKON, Pfaeffikon (CH)

( * ) Notice: Subject to any disclaimer, the term of this patent is extended or adjusted under 35 U.S.C. 154(b) by 719 days.

(21) Appl. No.: 12/510,543

(22) Filed: Jul. 28, 2009

(65) Prior Publication Data

US 2010/0236919 A1   Sep. 23, 2010

(30) Foreign Application Priority Data

Jul. 29, 2008   (EP) .................................... 08161322

(51) Int. Cl.
*C23C 14/34*   (2006.01)
*C23C 14/35*   (2006.01)
(Continued)

(52) U.S. Cl.
CPC ........... *C23C 14/3485* (2013.01); *C23C 14/35* (2013.01); *H01J 37/3408* (2013.01);
(Continued)

(58) Field of Classification Search
CPC .... C23C 14/35; C23C 17/3485; H01J 37/026; H01J 37/3467; H01J 37/3444; H01J 37/3408
(Continued)

(56) References Cited

U.S. PATENT DOCUMENTS 5,015,493 A    5/1991   Gruen
5,300,205 A *  4/1994   Fritsche ................... 204/192.12
(Continued)

FOREIGN PATENT DOCUMENTS

GB   2437730 A   11/2007
JP   07-90573    4/1995
(Continued)

OTHER PUBLICATIONS

European Search Report for Patent Application 08161322, Dec. 23, 2008.
(Continued)

*Primary Examiner* — Michael Band
(74) *Attorney, Agent, or Firm* — Greenblum & Bernstein, P.L.C.

(57) ABSTRACT

A high-power pulsed magnetron sputtering process, wherein within a process chamber by means of an electrical energy source a sequence of complex discharge pulses is produced by applying an electrical voltage between an anode and a cathode in order to ionize a sputtering gas. The complex discharge pulse is applied for a complex pulse time. The cathode has a target comprising a material to be sputtered for the coating of a substrate, and the complex discharge pulse includes an electrical high-power sputtering pulse having a negative polarity with respect to the anode and being applied for a first pulse-time, the high-power sputtering pulse being followed by an electrical low-power charge cleaning pulse having a positive polarity with respect to the anode and being applied for a second pulse-time. The ratio $\tau_1/\tau_2$ of the first pulse-time ($\tau_1$) in proportion to the second pulse-time ($\tau_2$) is 0.5 at the most.

16 Claims, 8 Drawing Sheets

Figure 1A:
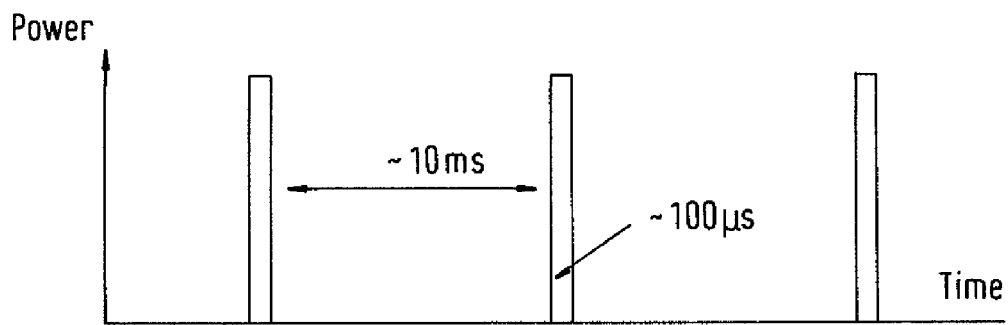

(51) Int. Cl.
*C23C 14/06* (2006.01)
*H01J 37/34* (2006.01)
*H01J 37/02* (2006.01)

(52) U.S. Cl.
CPC .......... *H01J 37/3467* (2013.01); *C23C 14/06* (2013.01); *H01J 37/026* (2013.01); *H01J 37/3444* (2013.01)

(58) Field of Classification Search
USPC ............. 204/192.12, 192.13, 298.03, 298.08
See application file for complete search history.

(56) References Cited

U.S. PATENT DOCUMENTS

| | | | |
|---|---|---|---|
| 5,660,700 A * | 8/1997 | Shimizu et al. | 204/298.08 |
| 6,296,742 B1 | 10/2001 | Kouznetsov | |
| 6,365,009 B1 * | 4/2002 | Ishibashi | 204/192.12 |
| 6,440,281 B1 * | 8/2002 | Sturmer et al. | 204/298.08 |
| 6,468,403 B1 * | 10/2002 | Shimizu et al. | 204/192.29 |
| 6,511,584 B1 * | 1/2003 | Szczyrbowski et al. | 204/192.22 |
| 7,147,759 B2 * | 12/2006 | Chistyakov | C23C 14/35 204/192.12 |
| 2005/0092596 A1 * | 5/2005 | Kouznetsov | 204/192.12 |
| 2008/0135400 A1 | 6/2008 | Kadlec et al. | |
| 2008/0210545 A1 | 9/2008 | Kouznetsov | |
| 2009/0252973 A1 | 10/2009 | Cremer | |

FOREIGN PATENT DOCUMENTS

| | | |
|---|---|---|
| JP | 8-53760 | 2/1996 |
| JP | 2007-162100 | 6/2007 |
| JP | 2009-534524 | 9/2009 |
| WO | 2006/049566 A | 5/2006 |
| WO | 2007/121954 | 11/2007 |

OTHER PUBLICATIONS

Arnell R D et al, "Recent Developments on Pulsed Magnetron Sputtering," Surface and Coating Technology, Nov. 1, 2004, pp. 158-163, vol. 188-189, Elsevier, Amsterdam, NL.

Helmersson U et al, "High Power Impulse Magnetron Sputtering Discharges and Thin Film Growth: A Brief Review," Annual Technical Conference Proceedings Society of Vacuum Coaters, Apr. 23, 2005, pp. 458-464, No. 48, Society of Vacuum Coaters, Albuquerque, NM, USA.

Ehiasarian et al., "High power pulsed magnetron sputtered CrNx films", Surface and Coatings Technology 163-164, 2003, pp. 267-272.

Translation of Japanese Office Action conducted in counterpart Japanese Appln. No. 2009-131896 (Jul. 9, 2013).

Translation of Japanese Office Action conducted in counterpart Japanese Appln. No. 2009-131896 (Apr. 4, 2014).

Translation of Japanese Office Action conducted in counterpart Japanese Appln. No. 2015-047806 (Jan. 26, 2016).

\* cited by examiner

HIGH-POWER PULSED MAGNETRON SPUTTERING PROCESS AS WELL AS A HIGH-POWER ELECTRICAL ENERGY SOURCE

CROSS-REFERENCE TO RELATED APPLICATIONS

The present application claims priority under 35 U.S.C. §119 of European Patent Application No. 08161322.6 filed on Jul. 29, 2008, the disclosure of which is expressly incorporated by reference herein in its entirety.

The invention relates to a high-power pulsed magnetron sputtering process, as well as to a high-power electrical energy source in accordance with the preamble of the independent claim of the respective category.

In the sputtering coating process a kind of vapour is created, the atoms or molecules of which hit a substrate to be coated. The vapour is created by bombarding a target with ions derived from a gas, called the sputtering gas, which e.g. can be an inert gas such as argon. The ions are created by making an electric discharge, thereby producing electrons which ionize the gas. In magnetically enhanced or magnetron sputtering a magnetic field is created in such a way as to trap and concentrate the electrons produced in the electric discharge to form an electron cloud. This electron cloud, which for a suitable design of the magnetic field will be located at the surface of the target and have a high density of electrons, will then cause ionization of the sputtering gas in the region close to the target surface. The target has a lower electric potential than the region in which the electron cloud is formed and will then attract positive ions to move with a high velocity towards the target. The impact of these ions at the target dislodges atoms from the target material. The dislodged atoms will then move into the region outside the target surface and into all of the space where the discharge is made and the target is located. The atoms will fully be deposited on the walls of said space and thus also on the surface of the Substrate.

Due to the relatively high ionization efficiency of this process using magnetic confinement compared to other sputtering methods, relatively low power levels may be used, whereas at the same time high sputtering rates are achieved. Because electron losses perpendicular to the magnetic field intensity lines are restricted by the suitably designed geometry of the magnetic field, bombardment of the Substrate is minimized and the heating of the Substrate, in particular of the growing film on the Substrate, is significantly smaller than in other sputtering methods. Electron losses in the directions of the magnetic field intensity lines are determined by the combined geometry of the magnetic and electrostatic fields, which can be designed to form a so called mirror confinement of the electrons.

However, magnetron sputtering has some drawbacks compared to other sputtering methods. One of the most important drawbacks is the low utilization of the target and the accompanying effect of obtaining deposited layers having a non-uniform thickness. This is caused by the localized ionization of the sputtering gas resulting essentially from the low electron temperature. Because of the low temperature and the confinement effects resulting from the geometry of the magnetic and electric fields, electrons which cause the ionization are concentrated in narrow regions above or at some small distance from the surface of the target. These narrow regions are also located between the poles of the magnets used for setting up the magnetic field. In these narrow, localized regions most of the ionization of the sputtering gas occurs. After the ionization the ions move and are accelerated towards the surface of the target, in paths substantially perpendicular to that surface. The location of the ionization regions will thus be mapped on the target surface resulting in a non-uniform erosion or wear of the target which in turn causes that only a restricted portion of the target can be used until it has been eroded through. The amount of ionized gas can be increased by increasing the voltage applied but then the probability of arc formation could be very high.

Magnetically enhanced sputtering is widely used in science and technology such as for coating object with various materials. The most important areas, in which magnetically enhanced sputtering is used, generally comprise magnetron sputtering devices intended for coating of work pieces. Also, in sputtering ion pumps for creating very low pressures a magnetically enhanced sputtering process is used in which the coating of some object is not the primary object, but in the process when fresh sputtered atoms are deposited on wall surfaces of a chamber they will adsorb molecules or atoms of the ionizing gas, lowering the pressure thereof.

Sputtering ion pumps are today used in a lot of different branches of science and technology where a high vacuum is required and used. In science, e.g. in atom physics, nuclear physics such as in particle accelerators, solid state physics, plasma physics for research in thermo-nuclear fusion, and in different investigations in electronics and microelectronics and in developing processes of deposition of layers for optical devices, for instruments, etc. In technology sputtering ion pumps are used in the processing for manufacturing electronic and microelectronic circuits, in industrial particle accelerators producing coatings for optical devices such as lenses and panes, in producing cutting and abrasive tools and in many other fields.

However, conventional sputtering ion pumps as well as other sputtering devices used today have some drawbacks.

The most important drawback is the limited discharge power resulting from the fact that a degassing of electrodes can occur owing the heating thereof during the discharge used in the sputtering process. If the discharge power used in the conventional sputtering process is too high, the electrodes will be heated so much, that the rate of degassing of the electrodes exceeds the gas adsorption intensity of the electrodes. This phenomenon is most critical in the pressure range of $10^{-2}$-$10^{-5}$ torr. When starting the operation of a conventional sputtering ion pump in the pressure range of $10^{-2}$-$10^{-3}$ torr, the pump operation is thus characterized by a low voltage between electrodes of about $-200$ V and a high discharge current. Because of the low voltage the efficiency of sputtering for adsorbing atoms/molecules, also called getter sputtering, is very low and accordingly the pumping speed is also very low. If the discharge current is increased, the temperature of the electrodes will also be increased and consequently also the rate of degassing the electrodes. Also, in the somewhat lower pressure range of $10^{-3}$-$10^{-5}$ torr the discharge current is still too high and it is necessary to arrange a limitation of the discharge power.

Furthermore, coating by means of sputtering and in particular magnetron sputtering is used within a multitude of technical fields. It can be used to produce anti-corrosion coatings, wear resistive coatings, thermo-resistive coatings, decorative coatings, optical coatings, transparent electroconductive coatings for displays, coatings of polymers with metallic films, ferromagnetic coatings for magnetic memories, superconducting coatings for memory cells, ultrafine coatings for photo and X-ray patterns, hard coatings (carbides, nitrides), resistive coatings, metallization in electronics and microelectronics, metallization of RF, HF and UH equipment, etc.

Advantageous characteristics of coatings produced by magnetron sputtering comprise for example a high adhesion to the Substrate and a low porosity. Furthermore, magnetically enhanced sputtering will cause only small radiation damages to the Substrate to be coated. Owing to the fact that a low temperature of substrate can be maintained during the coating process, also delicate materials can be coated. Magnetically enhanced sputtering allows a high sputtering rate and is also suited for reactive sputtering, in which atoms sputtered from the target combine with atoms in the gas to produce a coating consisting of molecules formed by the combined atoms. Furthermore, it allows sputtering of superconductive materials, sputtering of ferromagnetic materials, sputtering of composite materials and sputtering of materials having high melting temperatures.

Magnetron sputtering is in many respects advantageous compared to other similar coating methods such as electron-beam evaporation and RF-sputtering.

As already has been observed, the conventional methods of magnetically enhanced sputtering such as magnetron sputtering and sputtering ion pumps have a number of draw-backs.

Therefore, methods have been proposed in which the power to the sputtering process is provided in discrete or individual pulses.

For example in U.S. Pat. No. 6,296,742 B1 a magnetically enhanced sputtering process and a corresponding apparatus are disclosed primarily intended for both, producing coatings on substrates as well as for a sputtering ion pump process intended for producing very low pressures, in both cases however sputtered layers being produced.

In the magnetically enhanced sputtering method and the corresponding magnetically enhanced sputtering device according to U.S. Pat. No. 6,296,742 B1, a pulse generator is provided producing very powerful discrete pulses, the pulses being delivered to the electrodes of a magnetron sputtering unit primarily intended for producing coatings or to the electrodes of a sputtering ion pump intended for producing very low pressures.

The power of each pulse can be in the range of 0.1 kW to 1 MW and preferably within the range 10 kW-1 MW for typical areas of the targets conventionally used in sputtering devices. The pulses can have a duration in the range of less than a hundred microseconds up to hundreds of microseconds and the intervals between pulses can range from hundreds of microseconds up to hundreds of milliseconds, in very special cases up to seconds.

A magnetic field is arranged at the surface of a target, the magnetic field having the conventional structure such as a magnetron configuration. The target is a usually stationary object, from which material is to be sputtered in order to be deposited onto a substrate. A gas which is chosen so that it can be ionized is supplied to the chamber containing the target. A negative voltage is applied between an anode and a cathode in the chamber, the cathode being the target and the anode e.g. parts of the walls of the chamber. An electric discharge then occurs between the anode and the cathode, producing electrons trapped in the magnetic field by cooperation of the electric field produced by the applied voltage.

The negative voltage is applied in pulses having such a peak voltage and being provided in such a way, i.e. that so much power is developed in each pulse, that in the application of such a pulse, for a very short time during the start of the pulse, the state of the gas located at the region in which the electrons are trapped by the magnetic field will very rapidly reach a nearly fully ionized state creating a substantially homogeneous plasma in a wider region extending at a large portion of the surface of the target and being located where crossing magnetic and electric fields exist. In the very rapid transition to the fully ionized state, the gas located in said region first adapts the state of a glow discharge, then continues to the state of an arc discharge in order to finally adopt a fully ionized state. In that way the rate of ionizing the sputtering gas is strongly increased compared to conventional methods. This to effect is thus primarily achieved by strongly increasing the instantaneous power of the discharge, which then must be pulsed, since otherwise the target and the components of the sputtering chamber would be heated too much. Thus an extremely high absolute level of pulsed electric power or equivalently an extremely high level of the power density in the electric pulses generated is provided to the sputtering device. This is accomplished using these electric pulses directed to the cathode, which have an extremely high power density as referred to the area of the cathode.

In the discharge very high currents and high current densities occur. However, if the current used is lower than a threshold value called the burn-out current, the discharge will always be an arc discharge, even if there are no oxide layers at the surface of the target.

It has been found that conventional magnetron sputtering devices can operate at such a high power level in the pulses without causing any significant formation of arc discharges, both in non-reactive and reactive sputtering. This high power level permits the production of a nearly fully ionized plasma in the vicinity of the cathode, for a sufficiently high current density and a sufficiently high applied voltage. This discharge state is then far away from the glow discharge region used for conventional sputtering and can be called a state of pulsed powerful discharges in crossed/crossing electric and magnetic fields, an E×B-discharge.

The discharge pulses according to U.S. Pat. No. 6,296,742 B1 can be delivered from a charged capacitor through an inductor connected in series with the electrodes of the sputtering device, the pulses then having a shape comprising a very steep rising edge up to a peak voltage, this voltage then decreasing basically like an exponentially decreasing function.

Of course, there are other pulse sequences known in the state of the art. The aforementioned method is e.g. different from the method according to U.S. Pat. No. 5,015,493 in which square pulses are used. However, the load consisting of the gas between the electrodes in the sputtering device will at each instant determine the exact pulse shape, for instance maintaining a rather high, substantially constant voltage when the gas is in the highly ionized state of crossing electric and magnetic fields, as long as the input voltage is sufficient to sustain this state. Such pulses can easily be generated by an electric circuit having few components, using in addition to the capacitor and the inductor conventional solid state switches such as thyristors and rectifier diodes. The electric circuit can be adapted to generate pulses of a power up to e.g. 10 MW and the peak voltage of the generated pulses can range from zero up to tens of kilovolts. The peak voltage determines the power of the pulses and thus the power density generated in the sputtering device and the current passing between the electrodes and thus the current density.

Thus, the pulse generator generally comprises a discharge capacitor which is connected to be charged from a power supply. The capacitor is arranged to be discharged over the electrodes of the sputtering device through an inductor, the inductance of which is selected to limit the peak current or the peak current density, respectively, of the discharge in order to obtain the desired plasma state of the sputtering gas. The capacitor can be charged through a diode from the secondary side of a first transformer. A switch element such as a semiconductor switch can be connected in a line extending from the capacitor to the electrodes for switching to the discharge state. The switch is then advantageously controlled to adopt a conducting state by an alternating voltage having a substantially 180° offset in relation to an alternating current obtained from a power supply, also supplying power to the first transformer. This alternating voltage can then be obtained from the secondary side of a second transformer connected on its primary side to the same mains supply as the first transformer.

As already stated, the nearly complete ionization of the gas in the vicinity of the target during the powerful pulses allows that a high voltage is applied over the gap between the anode and the cathode target still maintaining the sputtering process without any formation of an electric arc. This can be achieved even in the pressure range of $10^{-1}$-$10^{-3}$ torr. The upper pressure limit is defined by the requirement of having electrons moving correctly in the intended way in the magnetic field. The voltage during the state of the completely ionized plasma can be hundreds of volts up to several kilovolts, in particular up to 4-5 kV. This phenomenon allows starting a sputtering ion pump for initial pressures of $10^{-1}$-$10^{-2}$ torr.

The nearly complete ionization in an extended region results in a substantially uniform bombardment of the surface of the target, which gives a high rate of target utilization. For example, an aluminum disk having a thickness of 6 mm used as a target for sputtering according to the method described in U.S. Pat. No. 6,296,742 B1 has a rate of utilization of 70%. The homogeneous ion flow will also result in a high uniformity of the layers deposited on e.g. a substrate.

In the following, some essential well known principles and properties of the so called "High-Power Impulse Magnetron Sputtering" (HIPIMS) or "High-Power Pulsed Magnetron Sputtering" (HPPMS) will be summarized in brief.

In FIG. 1a a typical well known pulse sequence for High-Power Magnetron Sputtering is displayed. The sequence according to FIG. 1a consists of equally spaced high-power pulses, each single pulse having a duration of about 100 μs. The time interval between two pulses is about 10 ms.

Figure 1B:
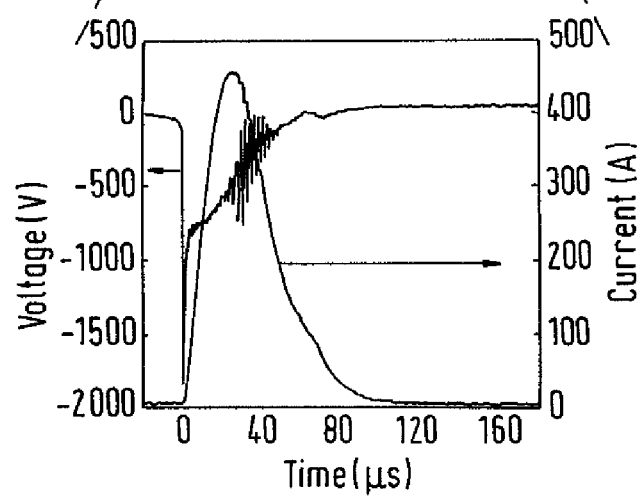

FIG. 1b shows the time dependent developing of the voltage and current, respectively, which are associated with a pulse according to FIG. 1a. An electric voltage of about −1800V is applied between the cathode, which is the target, and the anode, which is e.g. the wall of a process chamber. The voltage peak is extremely sharp and the voltage between the cathode and the anode first relaxes within a few microseconds from about −1800V to half of this value, reaching then about 0V after about 50 μs. The associated current sharply increases from 0 A to its maximum value at about 450 A after about 30 μs and decreases back to 0 A after about 100 μs. The appropriate calculated product of voltage and current results in a high-power pulse according to FIG. 1a.

In Table 1 a comparison of typical electrical process values between "High-power Pulses" (HPP) used in High-Power Magnetron Sputtering methods and "DC-Conventional Sputtering" is given. The difference is evident. In HIPIMS and HPPMS significantly higher Peak Power Density is applied resulting from significantly higher Peak Voltages and Peak Currents, respectively, used in High-Power Magnetron Sputtering methods.

TABLE 1 comparison of HPP and DC-Conventional Sputtering

| | HPP | DC-Conventional Sputtering |
|---|---|---|
| Peak Voltage | ca. 0.8-2 KV | ca. 300 V-500 V |
| Peak Current Density | ca. 1-10 A/cm$^2$ | ca. 10 mA/cm$^2$ |
| Peak Power Density | ca. 1-20 KW/cm$^2$ | ca. 1-10 W/cm$^2$ |
| Duty Factor | ca. 1% | ca. 100% |

Increasing the applied electrical power by using well spaced short pulses leads to a denser plasma without overheating the target wherein at the same time the erosion of the target, that is the exploitation of the target is improved. Due to the denser plasma, that is due to the much higher degree of ionization rate up to 100%, the sputtered coatings show excellent feature as already described above.

Of course, there are a variety of different embodiments of High-Power Magnetron Sputtering methods known in the state of the art using high-power pulses according to FIG. 1a and FIG. 1b.

For example, uni-polar methods are well known in the state of the art in which two subsequent high-power pulses have the same polarity, that is for example, the target is always the negative electrical pole and the wall of the process chamber is always the positive electrical pole of the high-power pulses. An example for a uni-polar pulse sequence is exemplarily shown by FIG. 2a.

Figure 2A:
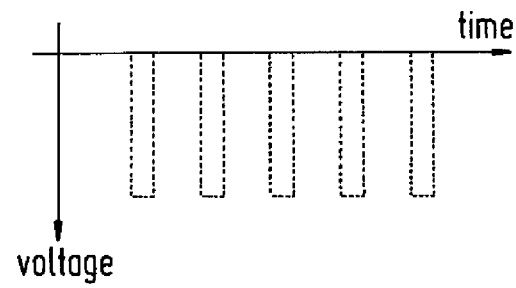
Figure 2B:
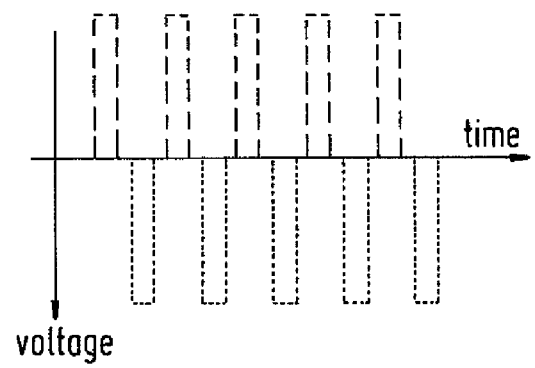

On the other hand, also bi-polar methods according to FIG. 2b are well known which are characterized in that two subsequent high-power pulses have different polarity. That is, regarding a first high-power pulse, the target is for example the negative electrical pole wherein for a subsequent second high-power pulse the target is the positive pole of the sputtering system.

Figure 2C:
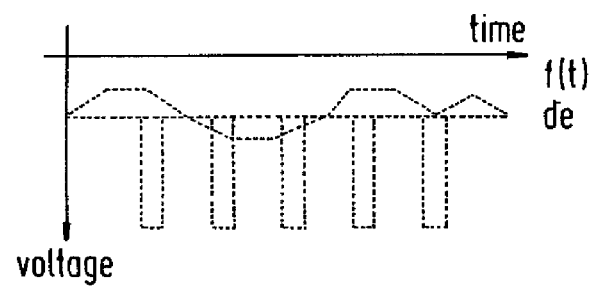

By FIG. 2c a so called "Superimposed Mode" is displayed. The superimposed mode is a special embodiment of a uni-polar pulse sequence wherein in addition to the uni-polar sequence according to FIG. 2a a DC-Voltage of a given value is superimposed.

Figure 2D:
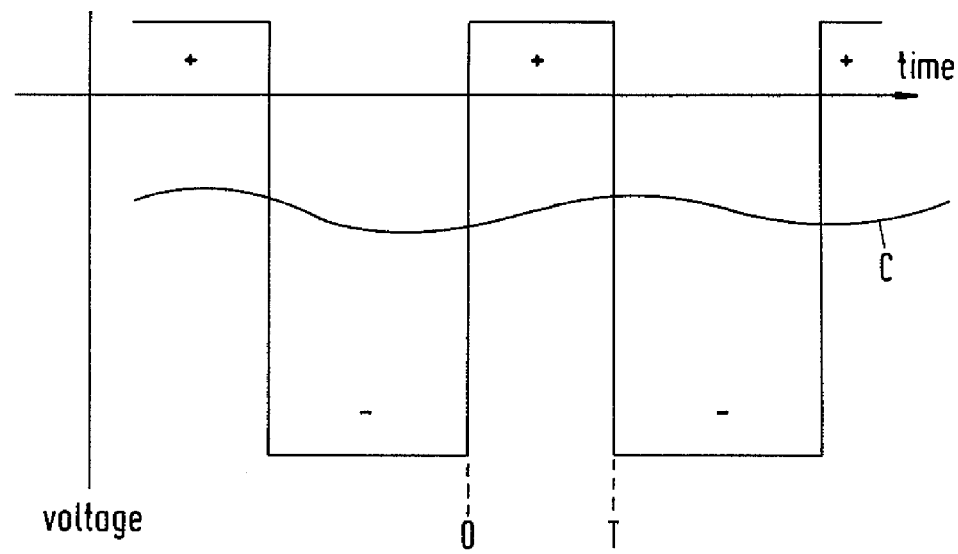

Another bi-polar pulse sequence is shown by FIG. 2d. In principle, the sequence of FIG. 2d represents also a superimposed mode wherein in addition to a uni-polar negative pulse sequence a positive DC-voltage of a given value is superimposed so that the voltage between two subsequent negative pulses has a positive value corresponding to the superimposed positive DC-voltage. The magnitude of the positive DC-voltage is smaller than the magnitude of the negative sputter pulses. The curve C represents schematically the time dependence of the corresponding current. A mean value of the current is for example about 10 A, wherein the power of the pulses is for example about 10 KW. Please note that the current does not show any significant peaks but has a smooth characteristic. In addition, the length of the negative pulses is longer compared to the interval between two pulses, in which interval a smaller positive voltage is applied.

It is also possible to vary the length and/or the interval between subsequent high-power pulses in pure uni-polar or bipolar pulse sequences and so on.

High-power pulse sequences can also be very advantageously applied in reactive sputtering methods as well as in non-reactive sputtering methods in a manner as well known by the person skilled in the art.

The method of choice to be used may depend on a variety of boundary conditions and requirements to be fulfilled, and may for example depend on the substrate, the type of elements required for the coating, the required properties of the films to be coated and so on.

But although high-power pulse/impulse magnetron sputtering has some advantages compared with conventional sputtering methods, there are some drawbacks regarding high-power Impulse magnetron sputtering (HIPIMS), also sometimes called high-power pulsed magnetron sputtering (HPPMS).

One problem related with high-power sputtering is the charging of the surface of the substrate with capacitive charges.

Figure 3:
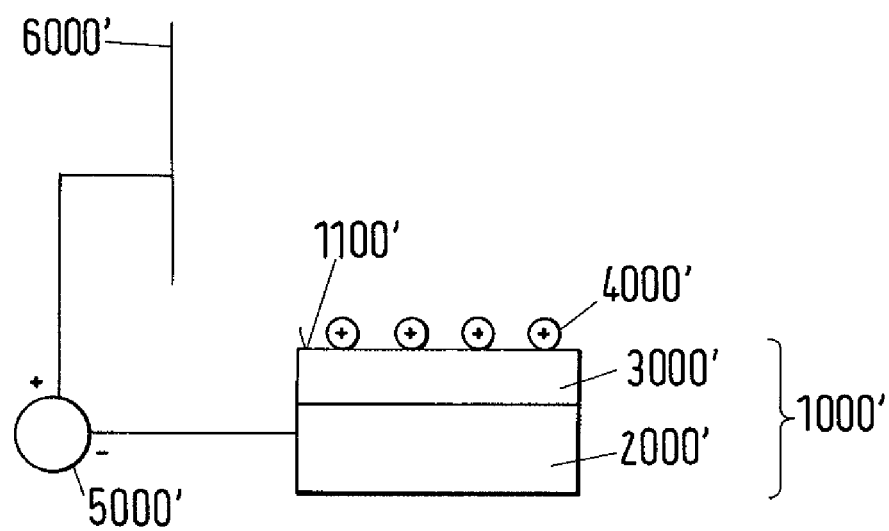

In FIG. 3 target 1000' is shown comprising a metallic base material 2000' on which an oxide layer 3000' is provided consisting of an oxide material to be sputtered onto a substrate which is not shown in FIG. 3. This arrangement is in principle a capacitor being able to collect electric charges. In case that for example a uni-polar high-power sputtering method in accordance with FIG. 2a is applied, the metallic base material 2000' of the target 1000' is connected to the negative pole of a power supply 5000' and, thus, will have a negative potential with respect to the wall 6000' of the chamber which is connected to the positive pole of the power supply 5000'. As a result, the target 1000' will accumulate positive ions 4000' onto its surface 1100' leading to a reduction of the negative potential of the target 1000', and in turn leading on the one hand to a deterioration of the ionization process in the vicinity of the surface 1100' of the target 1000' and thus to a deterioration of the sputtering process as such.

In order to reduce the positive electrical charges on the surface 1100' of the target 1000', between two negative pulses a positive voltage according FIG. 2d is applied to the target 1000'. The positive voltage applied to the target between two negative pulses cleans the surface 1100' from the positive charges. The amount of charge cleaning can be calculated using the so called "Work Function $V_+$" by the expression:

$$\int_0^T V_+ \cdot dt$$

wherein T is the duration of charge cleaning between two negative pulses.

However, a drawback of known pulse sequences according to FIG. 2d is on the one hand, that due to the relative large positive voltage applied to the target between two negative pulses electron are accelerated onto the target surface causing a not acceptable heating of the target. But if the surface of the target is not cleaned from the positive charges, the plasma will break down more or less immediately. On the other hand, due to the smooth characteristic of the current, the applied electrical power during the sputtering pulses is smudged over the pulse sequence what results in turn in a lower ionization degree of the sputtering gas. As well known from the state of the art, low ionized plasma gases are difficult to handle compared with a high ionized plasma and lead to a insufficient utilization of the target material. Furthermore, the coatings produced in the sputtering process are of poor denseness and poor uniformity.

Another important problem using a pulse sequence according to FIG. 2d arises from the fact that the current associated with the high-power sputtering pulses does not die-out after having switched of the high-power pulse but has always a value considerably different from zero.

As a consequence, electrons are accelerated to the target due to the permanently existing current leading to a considerable heating of the target.

And in addition, in many cases it is very difficult, in particular depending on the difference between the positive and the negative voltage to be applied for the high power sputtering pulse and the low power cleaning pulse, respectively, to properly switch the electrical energy source producing the pulses, from the relatively high negative voltage of the high-power negative pulse to the positive voltage of the low-power charge cleaning pulse, or vise versa, without any problems.

It is therefore an object of the invention to provide a magnetically enhanced high-power sputtering method and a respective sputtering device in which a high degree of ionization is achieved, wherein at the same time a surface of the target is cleaned from positive electrical charges wherein a heating of the target is avoided and a high rate of utilization of target material can be obtained. Thereby, the coating produced by the method of the invention shall be improved in respect of the coatings known from the state of the art, and, in particular, the coatings produced according to the invention should be improved in respect of denseness and uniformity.

The subject matter of the invention which satisfies these objects is characterized by the features of the independent claims of the respective category.

The subordinate claims relate to particularly advantageous embodiments of the invention.

The invention thus relates to a high-power pulsed magnetron sputtering process, wherein within a process chamber by means of an electrical energy source a sequence of complex discharge pulses is produced by applying an electrical voltage between an anode and a cathode in order to ionize a sputtering gas. Said complex discharge pulse is applied for a complex pulse time. The cathode has a target comprising a material to be sputtered for the coating of a substrate, and said complex discharge pulse includes an electrical high-power sputtering pulse having a negative polarity with respect to the anode and being applied for a first pulse-time, the high-power sputtering pulse being followed by an electrical low-power charge cleaning pulse having a positive polarity with respect to the anode and being applied for a second pulse-time. According to the present invention, a ratio $\tau_1/\tau_2$ of the first pulse-time ($\tau_1$) in proportion to the second pulse-time ($\tau_2$) is 0.5 at the most.

It is essential for the present invention, that the complex discharge pulse includes first the negative high-power sputtering pulse being applied for a relatively short first pulse-time, being followed by the comparatively long positive charge cleaning pulse.

Since the negative high-power pulse is applied only for a comparatively short interval of time having a high voltage of about 600V up to 1000V or more than 1000V, the corresponding current does not show a smooth characteristic but has a sharp peak structure and is timely sharp correlated with the sharp and very short pulse of the applied voltage. As a result, the applied electrical power is sharply concentrated and strong timely connected with the applied short voltage pulse so that the entire electrical energy is applied in a very short interval of time leading to a very high ionization of the plasma. A degree of ionization of nearly 100% can easily be achieved by using the process of the present invention.

Subsequent to the negative high-power sputtering pulse a positive low-power charge cleaning pulse is applied. Since during the charge cleaning pulse a very low voltage of for example 1V-10V is applied, on the one hand, the target is reliably cleaned from positive electrical charges, wherein at the same time a noticeable collecting of electrons is avoided so that in turn, a heating of the target is essentially avoided.

Preferably, the-ratio $\tau_1/\tau_2$ of the first pulse-time in proportion to the second pulse-time is between 0.005 and 0.5, in particular between 0.01 and 0.25, preferably between 0.05 and 0.1.

Regarding a special embodiment of the present invention, subsequent to the low-power charge cleaning pulse and before another high-power sputtering pulse is applied, the voltage between the anode and the cathode is switched off and/or is set to zero for a third pulse-time.

During the third pulse-time when the voltage applied to the target is switched off or set to zero, time is provided to the system to relax into a starting state so that during each single complex pulse essentially identical sputtering conditions are provided leading in connection with the high degree of ionization and the very effective charge cleaning procedure of the target to a film being coated onto the substrate which film has a high denseness and a significantly improved uniformity, and thus, significantly improved physical and chemical properties compared with the films sputtered by the methods known from the state of the art.

In addition to these advantages, using such a pulse sequence, the electrical energy source for producing the sputtering pulses can be easily and properly switched from the positive voltage for producing the low-power charge cleaning pulse to the relatively high negative voltage for producing the high-power negative sputtering pulse without any problems.

Regarding another special embodiment of the present invention, subsequent to the high-power sputtering pulse and before the low-power charge cleaning pulse is applied, the voltage between the anode and the cathode is switched off and/or is set to zero for the third pulse-time.

Such a complex high-power sequence is particularly suitable in case that the current has a relatively broad die-out region. As well known by the person skilled in the art, the current associated with the high-power sputtering pulse will not immediately go to zero after having switched of the high-power pulse but it takes some time until the current has died out. Thus, after the high-power pulse there will arise a more or less broad die-out region in which the current is still considerably different from zero.

As a consequence, in case that the low-power cleaning pulse is immediately applied after having switched off the high-power sputtering pulse, depending on the concrete boundary conditions of an actual sputtering process, electrons can be accelerated to the target due to the still existing current during the die-out period which can lead to a considerable heating of the target 8.

This problem can be easily avoided by using a special complex discharge pulse in which subsequent to the high-power sputtering pulse and before the low-power charge cleaning pulse is applied, the voltage between the anode and the cathode is switched off and/or is set to zero for the third pulse-time.

It is of course possible to combine the different embodiments according to the present invention. Thus, regarding an embodiment which is very important in practice, subsequent to the low-power charge cleaning pulse and before another high-power sputtering pulse is applied, the voltage between the anode and the cathode is switched off and/or is set to zero for a third pulse-time, and subsequent to the high-power sputtering pulse and before the low-power charge cleaning pulse is applied, the voltage between the anode and the cathode is again switched off and/or is again set to zero for the third pulse-time.

In order to switch off and/or to set the voltage between the anode and the cathode during the third pulse-time to zero, for example the power supply providing the electrical pulse energy can by switched from a the negative voltage of the high-power sputtering pulse to the positive voltage of the low-power charge cleaning pulse or vise versa.

Regarding another embodiment, a constant positive voltage is permanently applied between the anode and the cathode for example by using a first positive electrical power supply, and the voltage between the anode and the cathode is set to zero for the third pulse-time by applying additionally between the anode and the cathode a negative Voltage having the same magnitude as the permanently applied constant positive voltage by using for example, but not necessarily, a second negative power supply. Such an arrangement has the advantage that the power supply must not be switched from a positive voltage to a negative voltage or vise versa but has only to be switched from a high negative voltage to a lower negative voltage or vise versa.

Regarding a very special embodiment of the present invention, the high-power sputtering pulse und/or the low-power charge cleaning pulse is a low frequency AC-voltage, in particular a rectified low frequency AC-voltage.

The frequency of the high-power sputtering pulse und/or of the low-power charge cleaning pulse is for example between 0 Hz and 10 kHz, in particular between 10 Hz and 5 kHz, preferably between 25 Hz and 2 kHz and the voltage of the high-power sputtering pulse is e.g. between 100V and 3000V, preferably between 600V and 2000V.

Preferably, of course in many cases the high-power sputtering pulse und/or the low-power charge cleaning pulse is a DC-voltage as in principle well known from the state of the art.

The voltage of the low-power charge cleaning pulse is in an embodiment of the present invention, which is very important in practice between 0V and 500V, preferably between 1V and 300V, in particular between 1V and 100V.

Regarding the time intervals establishing the complex high-power pulse according to the present invention, the first pulse-time of the high-power sputtering pulse is between 1 µs and 5000 µs, in particular between 100 µs and 1000 µs, preferably between 25 µs and 2000 µs, wherein the second pulse-time of the low-power charge cleaning pulse is preferably longer than 25 µs, in particular longer than 1 ms, or longer than 25 ms, wherein the entire complex pulse time is between 50 µs and 1000 ms, in particular between 500 µs and 500 ms, preferably between 1 ms and 100 ms which complex pulse time defines in connection with the first pulse-time of the high-power sputtering pulse and the second pulse-time of the low-power charge cleaning pulse the time period in which the voltage applied to the target is set to zero or switched off.

Regarding a special embodiment, the peak current density of the high-power sputtering pulse is between 0.05 A/cm$^2$ and 5 A/cm$^2$, in particular between 0.5 A/cm$^2$ and 2 A/m$^2$, preferably between 0.1 A/cm$^2$ and 3 A/cm$^2$ and a peak power of the high-power sputtering pulse is between 0.1 MW and 3 MW, in particular between 0.5 MW and 2 MW, preferably about 1 MW, for example, but not only, depending on the area of the target surface.

Using a process according to the present invention, an ionization degree of the sputtering gas is between 50% and 100%, in particular between 75% and 95%, preferably about 90% and can reach up to nearly 100%.

Thereby, a process in accordance with the present invention is suitable for both reactive sputtering method and non-reactive sputtering processes as in principle well known from the state of the art.

In a special embodiment, the substrate is coated with a ceramic material, in particular with a nitride and/or by an oxide and/or by a carbide, wherein the process according to the present invention is not restricted to the aforementioned classes of materials.

Furthermore, the present invention relates also to a high-power electrical energy source for producing a complex discharge pulse for carrying out a process in accordance with the invention.

Figure 4:
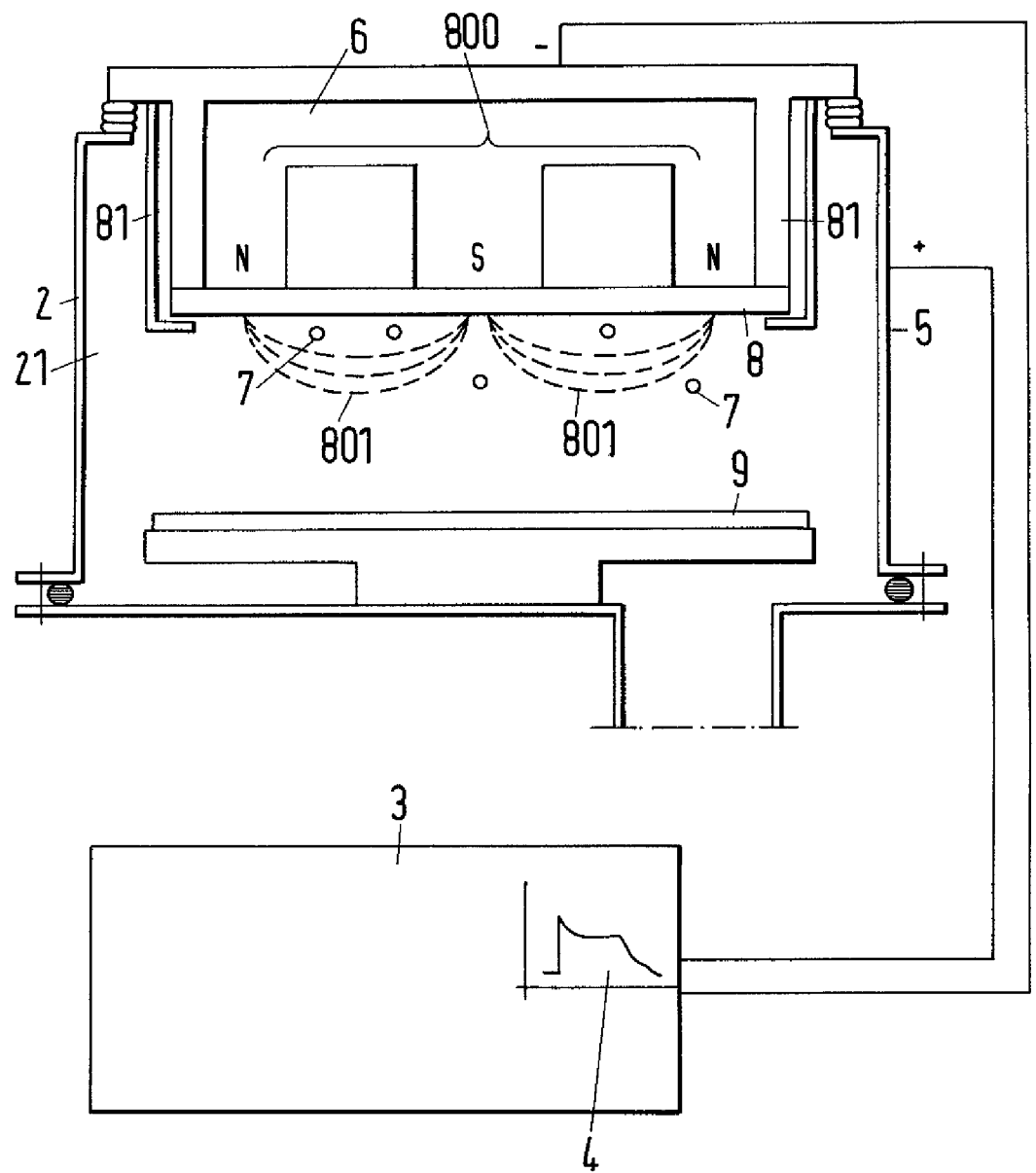
Figure 5:
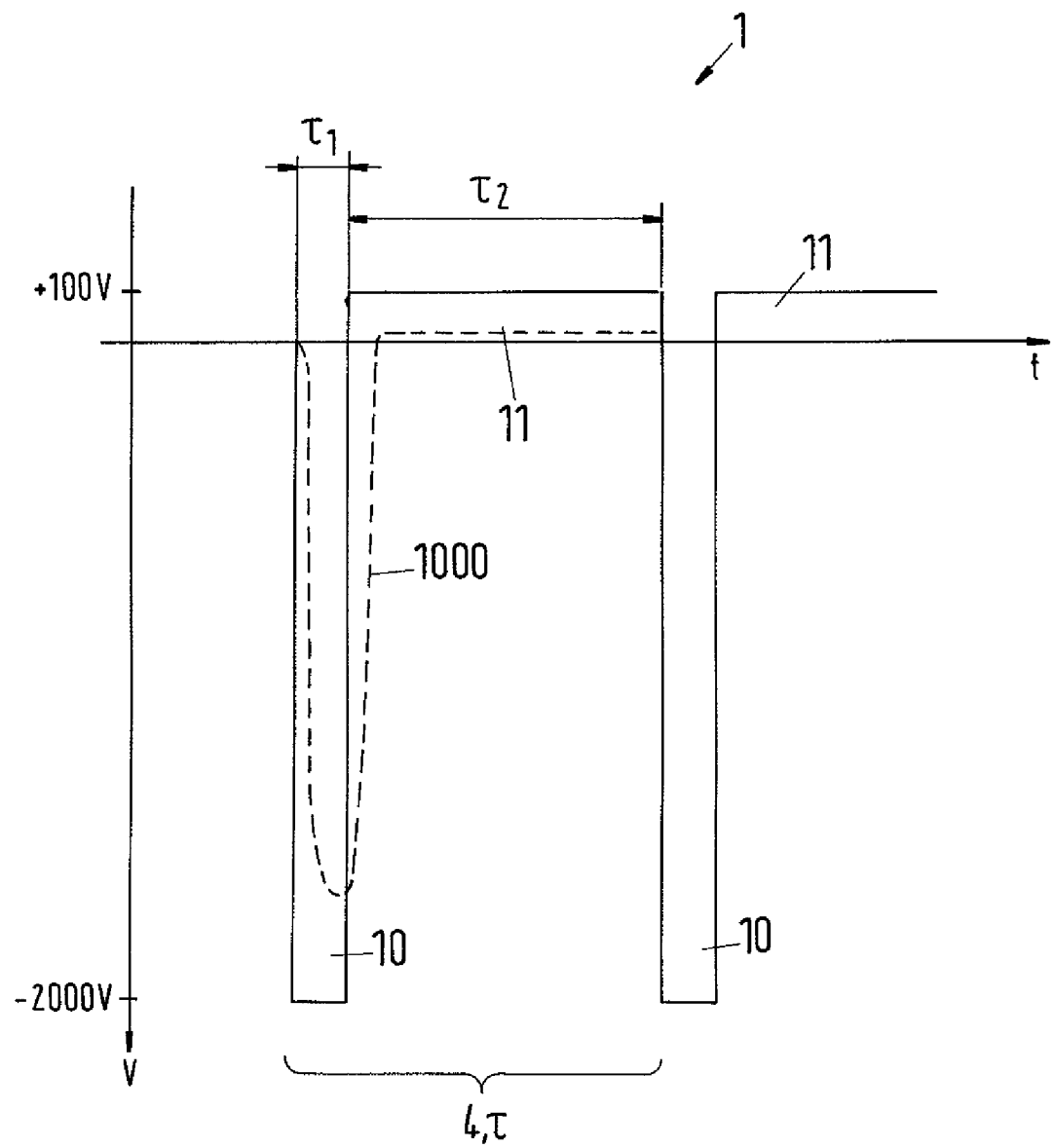
Figure 6:
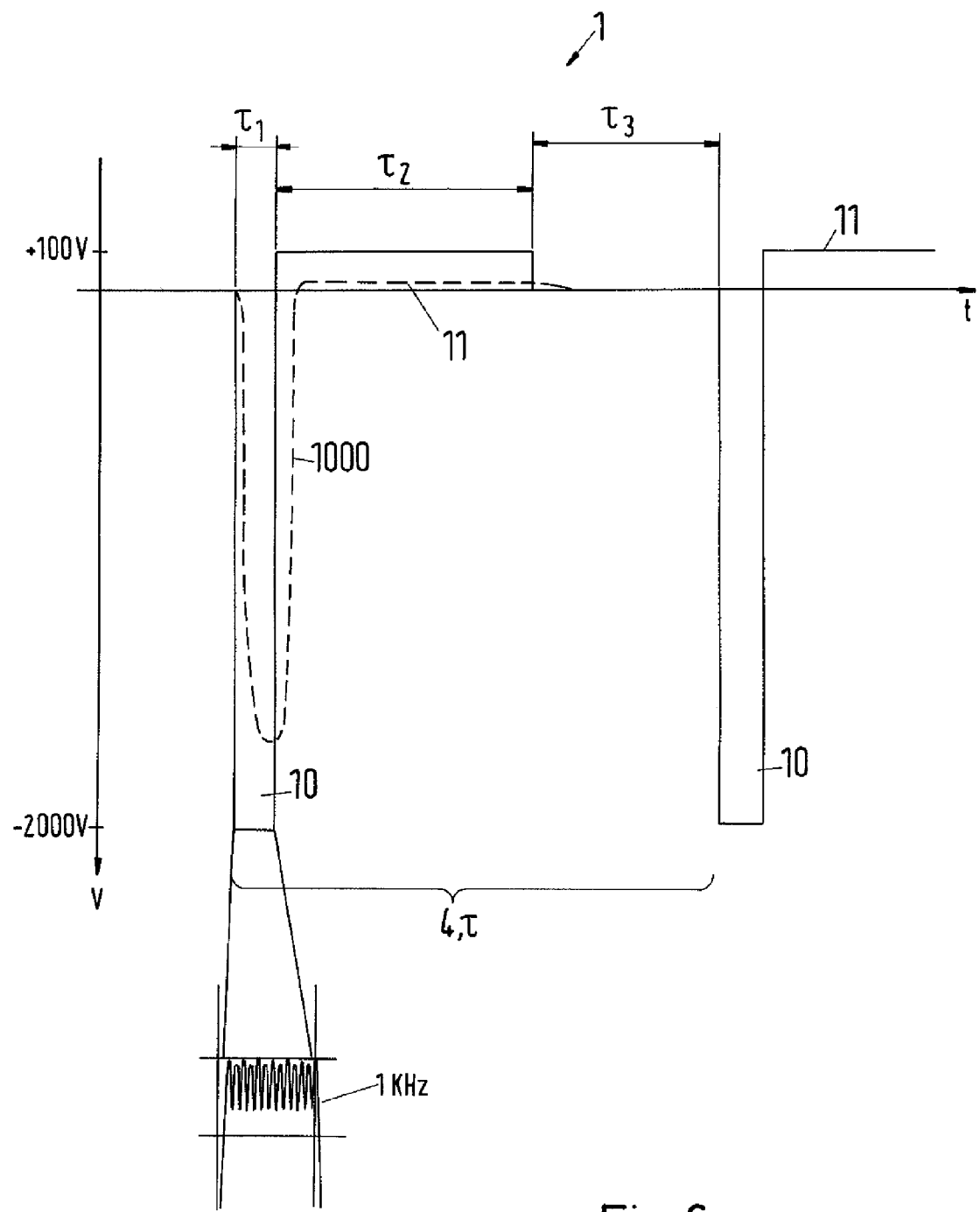
Figure 7:
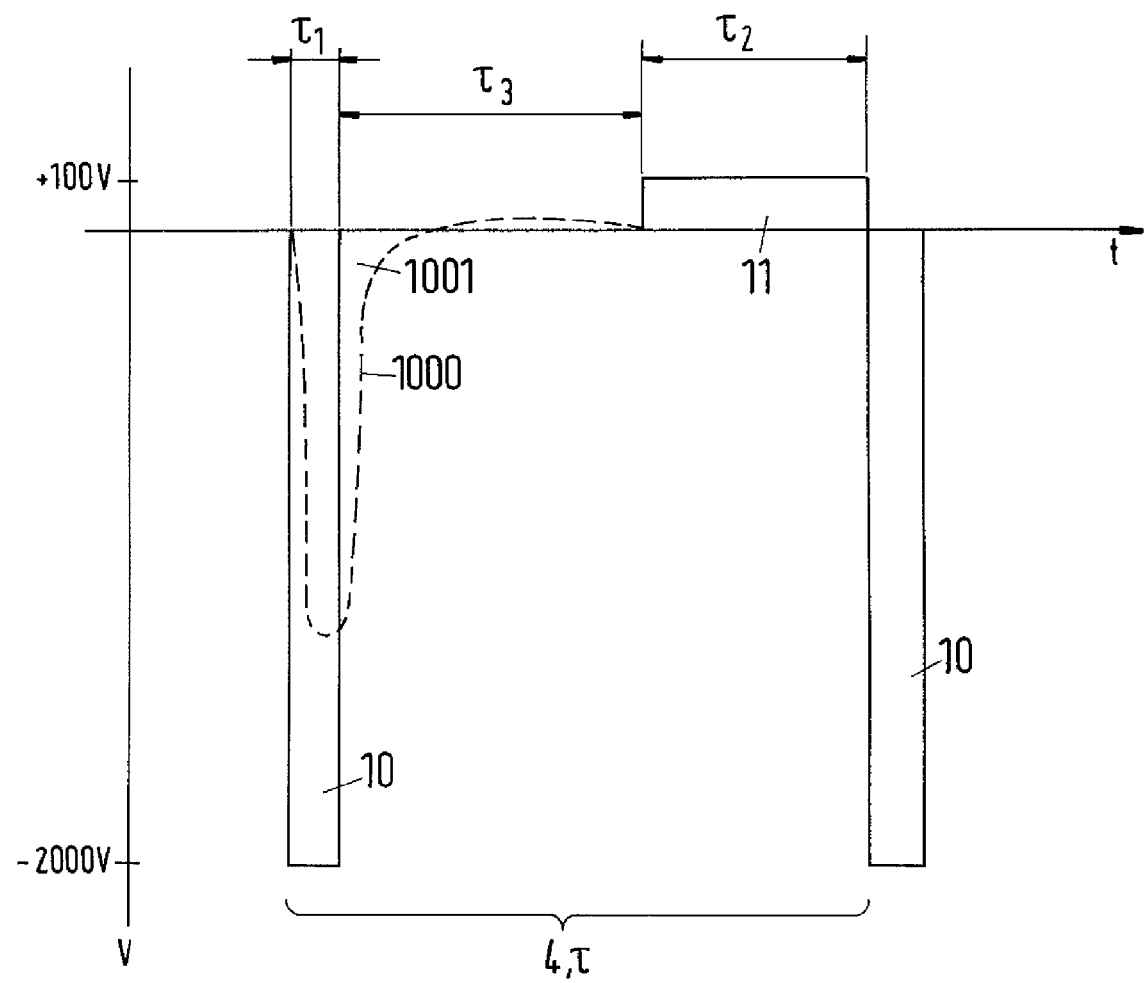
Figure 8:
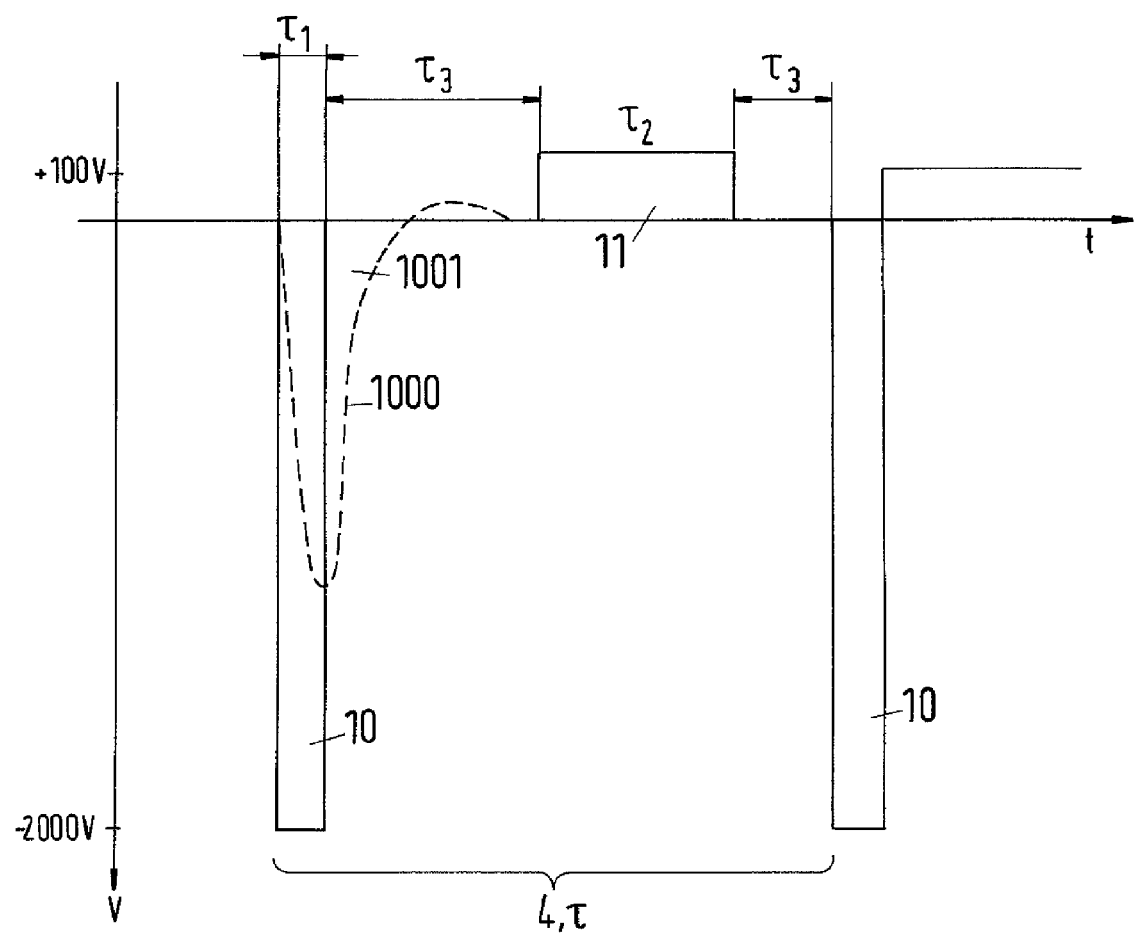

In the following, the invention will be explained in more detail with reference to the drawings. Shown are:

FIG. 1a: a known unipolar high-power magnetron sputtering sequence;

FIG. 1b: a high-power pulse according to FIG. 1a;

FIG. 2a: time dependence of the voltage for a pulse sequence according to FIG. 1a;

FIG. 2b: a known bipolar high-power magnetron sputtering sequence;

FIG. 2c: a known superimposed high-power magnetron sputtering sequence;

FIG. 2d: another superimposed high-power magnetron sputtering sequence;

FIG. 3: a sputtering target having accumulated positive ions:

FIG. 4: a process chamber for carrying out the invention;

FIG. 5: a complex high-power discharge pulse according to the invention;

FIG. 6: a second embodiment of a complex high-power pulse according to FIG. 5;

FIG. 7: a third embodiment of a complex high-power pulse according to FIG. 5;

FIG. 8: an embodiment combining the complex high-power pulses of FIG. 6 and FIG. 7.

FIG. 1 to FIG. 3 which are related to pulse sequences or problems known from the state of the art, have already been discussed in great detail and thus, the discussion is continued with FIG. 4 and FIG. 5 showing both a process chamber for carrying out the present invention and schematically a high-power pulse according to the invention.

By FIG. 4 a process chamber 2 for carrying out the invention is displayed which process chamber 2 is, apart from the electrical energy source 3, in principle well known from the state of the art. A similar process chamber is for example disclosed in WO 2006/049566 A1.

A sputtering chamber 21 is formed in the interior of the process chamber 2 having walls 5 made of e.g. stainless steel plate, the walls of the housing thus being electrically conducting and acting as the anode 5. The housing has for example the shape of a circular cylinder. The target 8 is located in parallel to the flat end walls of the cylinder and is carried by a support 81 made of electrically conducting material. The target 8 is a circular plate of material, which is to be applied to a substrate in order to establish a coating in form of a film.

At the rear end of the target 8, at a surface which is not directed towards the center of the chamber 2, a magnet assembly 800 is mounted so that the north pole or poles are arranged at the periphery of the target and the south pole or poles at the center of the support 81 and the target 8. Thus, the magnetic fiel lines 801 of the magnets 800 pass from the periphery of the support 81 to the center thereof. The magnetic field is most intense at the poles of magnets 800. It is understood that also other known configurations can also be advantageously used.

The electric system of the sputtering device includes electrodes between which a voltage from the power supply 3 is applied for ionizing the sputtering gas 7 in the process chamber 2. In the illustrated embodiment, the anode 5 is formed by the electrically conducting walls 5 of the chamber 2, which e.g. can be grounded. Of course, alternatively e.g. a separate anode, not shown in FIG. 4, can be used. The cathode 6 is formed by the target 8 and is negatively biased in relation to the anode 5. The substrate 9 can have some suitable electrical potential.

According to the invention, a high-power electrical energy source 3 is provided to establish a complex discharge pulse 4 as for example described in detail by FIG. 5 showing a very simple complex discharge pulse 4 according to the present invention.

The special embodiment of a complex discharge pulse 4 according to the present invention displayed by FIG. 5, is produced by means of the electrical energy source 3 providing a sequence of complex discharge pulses 4 by applying an electrical voltage V between the anode 5 and the cathode 6 in order to ionize the sputtering gas 7 as shown in FIG. 4. The complex discharge pulse 4 is applied for a complex pulse time τ. The complex discharge pulse 4 includes an electrical high-power sputtering pulse 10 having a negative polarity with respect to the anode 5 and being applied for a first pulse-time $\tau_1$. The high-power sputtering pulse 10 und/or the low-power charge cleaning pulse 11 is preferably a DC-voltage pulse as in principle well known from the state of the art.

The high-power sputtering pulse 10 is then followed by an electrical low-power charge cleaning pulse 11 having a positive polarity with respect to the anode 5 and being applied for a second pulse-time $\tau_2$. According to the invention, a ratio $\tau_1/\tau_2$ of the first pulse-time ($\tau_1$) in proportion to the second pulse-time ($\tau_2$) is 0.5 at the most. In the present example of FIG. 5 the ratio $\tau_1/\tau_2$ of the first pulse-time ($\tau_1$) in proportion to the second pulse-time ($\tau_2$) is about 0.17.

Choosing a relatively low ratio $\tau_1/\tau_2$ which is much smaller than one, that is $\tau_1/\tau_2<1$ as e.g. schematically shown by FIG. 5, and at the same time applying a very low voltage of for example 1V-10V during the charge cleaning pulse time $\tau_2$, the target 8 is reliably cleaned from positive electrical charges, wherein at the same time a noticeable collecting of electrons is avoided so that in turn, a heating of the target 8 is also essentially avoided.

Since the negative high-power pulse 10 is applied only for a comparatively short interval of time having a high voltage of about 600V up to 1000V or more than 1000V, the corresponding current 1000, which is for reasons of simplicity only shown for the first high-power sputtering pulse 10 by the dashed line 1000, does not show a smooth characteristic but has a sharp peak structure and is timely sharp correlated with the sharp and very short pulse 10 of the applied negative voltage. As a result, the applied electrical power is sharply concentrated and strong timely connected with the applied short voltage pulse 10 so that the entire electrical energy is applied in a very short interval of time leading to a very high ionization of the plasma.

By FIG. 6 a second embodiment of a complex high-power pulse 4 according to the present invention is displayed which complex high-power pulse 4 is very important in practice. The complex high-power pulse 4 according to FIG. 6 is produced by means of the electrical energy source 3 providing a sequence of complex discharge pulses 4 by applying an electrical voltage V between the anode 5 and the cathode 6 in order to ionize the sputtering gas 7 as shown in FIG. 4. The complex discharge pulse 4 is applied for a complex pulse time τ. The complex discharge pulse 4 includes an electrical high-power sputtering pulse 10 having a negative polarity with respect to the anode 5 and being applied for a first pulse-time $\tau_1$. The high-power sputtering pulse 10 und/or the low-power charge cleaning pulse 11 according to FIG. 6 is a low frequency AC-voltage, in particular a rectified low frequency AC-voltage. Regarding the special embodiment of FIG. 6 the frequency of the high-power sputtering pulse 10 und/or of the low-power charge cleaning pulse 11 is about 1 kHz. The 1 kHz AC-pulse is also schematically displayed by FIG. 6. It is understood that the complex discharge pulse 4 can also be advantageously produced by using DC-voltage pulses 10, 11.

The high-power sputtering pulse 10 according to FIG. 6 is then followed by an electrical low-power charge cleaning pulse 11 having a positive polarity with respect to the anode 5 and being applied for a second pulse-time $\tau_2$. According to the special embodiment of FIG. 6, subsequent to the low-power charge cleaning pulse 11 and before another high-power sputtering pulse 10 is applied, the voltage V between the anode 5 and the cathode 6 is switched off and/or is set to zero for a third pulse-time $\tau_3$.

In addition to the advantages already described above, using the pulse sequence 4 according to FIG. 6, the electrical energy source 3 can be easily and properly switched from the positive voltage V for producing the low-power charge cleaning pulse 11 to the negative voltage V for producing the high-power negative sputtering pulse 10 without any problems.

Regarding FIG. 7, a third embodiment of a complex high-power pulse 4 according to FIG. 5 is displayed. The complex high-power pulse 4 according to FIG. 7 is of course also produced by means of the electrical energy source 3 by applying an electrical voltage V between the anode 5 and the cathode 6 in order to ionize the sputtering gas 7 as shown in FIG. 4. The complex discharge pulse 4 is applied for a complex pulse time τ. The complex discharge pulse 4 includes an electrical high-power sputtering pulse 10 having a negative polarity with respect to the anode 5 and being applied for a first pulse-time $\tau_1$.

The high-power sputtering pulse 10 according to FIG. 7 is then followed by the time period $\tau_3$ in which the voltage V between the anode 5 and the cathode 6 is switched off and/or is set to zero for the third pulse-time $\tau_3$.

Subsequent to the time period $\tau_3$ in which the voltage V is switched off or set to zero, the electrical low-power charge cleaning pulse 11 having a positive polarity with respect to the anode 5 is applied for the second pulse-time $\tau_2$.

The complex high-power sequence 4 according to FIG. 7 is particularly suitable in case that the current 1000 has a relatively broad die-out region 1001 as can be exemplarily seen by FIG. 7. As well known by the person skilled in the art, the current 1000 associated with the high-power sputtering pulse 10 will not immediately go to zero after having switched of the high-power pulse 10 but it takes some time until the current has died out. Thus, as clearly shown by FIG. 7, after the high-power pulse 10 there will arise a more or less broad die-out region 1001 in which the current 1000 is still considerably different from zero.

As a consequence, in case that the low-power cleaning pulse 11 is immediately applied after having switched off the high-power sputtering pulse 10, as for example showed by FIG. 6, depending on the concrete boundary conditions of an actual sputtering process, electrons can be accelerated to the target 8 due to the still existing current 1000 during the die-out period 1001 which can lead to a considerable heating of the target 8.

This problem can be easily avoided by using a special complex discharge pulse 4 according to FIG. 7.

Finally, FIG. 8 shows a very important embodiment of the present invention combining the advantages of the complex high-power pulses of both FIG. 6 and FIG. 7. The voltage V between the anode 5 and the cathode 6 is switched off and/or is set to zero for a second additional third pulse-time $\tau_3$, that is the voltage is brought to zero before the low-power cleaning pulse 11 is applied as well as after the low-power cleaning pulse 11 and before the next high-power sputtering pulse 11 is applied.

Thus, using a complex discharge pulse according to FIG. 8, a heating of the target due to the die-out period 1001 of the current 1000 is avoided and, at the same time, the electrical energy source 3 can be easily switched from the negative voltage V for producing the high-power negative pulse 10 to the positive voltage V for producing the low-power charge cleaning pulse 11 without any problems.

It is understood that the invention is not only related to the special embodiments discussed above but, of course, further embodiments are included, too. In particular, the invention relates to all advantageous combinations of the discussed embodiments.

Summarizing the discussion of the present invention, since the negative high-power pulse is applied only for a comparatively short interval of time having a high voltage of up to 1000V or more than 1000V, the corresponding current does not show a smooth characteristic but has a sharp peak structure and is timely sharp correlated with the sharp and very short pulse of the applied voltage. As a result, the applied electrical power is sharply concentrated and strong timely connected with the applied short voltage pulse so that the entire electrical energy is applied in a very short interval of time leading to a very high ionization of the plasma. A degree of ionization of nearly 100% can easily be achieved by using the process of the present invention.

In a special embodiment, subsequent to the negative high-power sputtering pulse a positive low-power charge cleaning pulse is applied. Since during the charge cleaning pulse a very low voltage of for example 1V is applied, on the one hand, the target is reliably cleaned from positive electrical charges, wherein at the same time a noticeable collecting of electrons is avoided so that in turn, a heating of the target is essentially avoided.

During the third pulse-time when the voltage applied to the target is switched off or set to zero, time is provided to the system to relax into a starting state so that during each single complex pulse essentially identical sputtering conditions are provided leading in connection with the high degree of ionization and the very effective charge cleaning procedure of the target to a film being coated onto the substrate which film has a high denseness and a significantly improved uniformity, and thus, significantly improved physical and chemical properties compared with the films sputtered by the methods known from the state of the art.

Further advantageous embodiments of the invention are presented.

The invention claimed is:
1. A high-power pulsed magnetron sputtering process, wherein:
producing within a process chamber via an electrical energy source, a sequence of complex discharge pulses to apply an electrical voltage (V) between an anode and a cathode in order to ionize a sputtering gas; and coating a substrate with a ceramic material, wherein each complex discharge pulse is applied for a complex pulse time ($\tau$) and the cathode being a target comprising a material to be sputtered for the coating of the substrate;

wherein the complex discharge pulse comprises an electrical high-power sputtering pulse having a negative polarity with respect to the anode that is applied for a first pulse-time ($\tau_1$) followed by an electrical low-power charge cleaning pulse having a positive polarity with respect to the anode that is applied throughout an entire second pulse-time ($\tau_2$), wherein a voltage of the high-power sputtering pulse is between 400V and 2000V, wherein a peak power density of the high-power sputtering pulse is between 1 and 20 KW/cm$^2$, wherein a ratio $\tau_1/\tau_2$ of the first pulse-time ($\tau_1$) in proportion to the second pulse-time ($\tau_2$) is 0.5 at the most, and wherein subsequent to the low-power charge cleaning pulse and before another high-power sputtering pulse is applied, the process further comprises at least one of switching off and setting to zero the voltage (V) applied between the anode and the cathode for a third pulse-time ($\tau_3$), said third pulse-time ($\tau_3$) being less than the second pulse-time ($\tau_2$), and wherein at least one of:

a peak current density of the high-power sputtering pulse is between 0.05 A/cm$^2$ and 5 A/cm$^2$, and a peak power of the high-power sputtering pulse is between 0.1 MW and 3 MW.

2. A process in accordance with claim 1, wherein the ratio $\tau_1/\tau_2$ of the first pulse-time ($\tau_1$) in proportion to the second pulse-time ($\tau_2$) is between 0.005 and 0.5.

3. A process in accordance with claim 1, wherein at least one of the high-power sputtering pulse and the low-power charge cleaning pulse is at least one of a low frequency AC-voltage, a rectified low frequency AC-voltage, and a DC-voltage pulse.

4. A process in accordance with claim 3, wherein the frequency of the at least one of the high-power sputtering pulse and the low-power charge cleaning pulse is between 0 Hz and 10 kHz.

5. A process in accordance with claim 1, wherein at least one of:

the voltage of the high-power sputtering pulse is between 600V and 2000V, and a voltage of the low-power charge cleaning pulse is between 0V and 500V.

6. A process in accordance with claim 1, wherein the first pulse-time ($\tau_1$) of the high-power sputtering pulse is between 1 µs and 5000 µs.

7. A process in accordance with claim 1, wherein at least one of:

the second pulse-time ($\tau_2$) of the low-power charge cleaning pulse is longer than 25 µs, and the complex pulse time ($\tau$) is between 50 µs and 1000 ms.

8. A process in accordance with claim 1, wherein an ionization degree of the sputtering gas is between 3% and 100%.

9. A process in accordance with claim 1, wherein at least one of:

the sputtering method for coating the substrate is a reactive sputtering method or a non-reactive sputtering process.

10. High-power electrical energy source for producing a complex discharge pulse for carrying out a process in accordance with claim 1.

11. A process in accordance with claim 9, wherein the ceramic material comprises at least one of a nitride, an oxide and a carbide.

12. A high-power pulsed magnetron sputtering process, said process comprising:

producing within a process chamber via an electrical energy source, a sequence of complex discharge pulses to apply an electrical voltage (V) between an anode and a cathode in order to ionize a sputtering gas, said cathode comprising an oxide target material that is sputtered onto a substrate:

applying each complex discharge pulse for a complex pulse time ($\tau$), said complex discharge pulse comprising an electrical high-power sputtering pulse having a negative polarity with respect to the anode that is applied for a first pulse-time ($\tau_1$) followed by an electrical low-power charge cleaning pulse having a positive polarity with respect to the anode that is applied for a second pulse-time ($\tau_2$) that is longer than the first pulse time ($\tau_1$);

subsequent to the electrical low-power charge cleaning pulse and before another electrical high-power sputtering pulse is applied, switching off and/or setting to zero the electrical voltage (V) applied between the anode and the cathode for a third pulse-time ($\tau_3$), said third pulse-time ($\tau_3$) being less than the second pulse-time ($\tau_2$):

utilizing a voltage of the high-power sputtering pulse of between 600V and 2000V; and utilizing a peak power density of the high-power sputtering pulse of between 1 and 20 KW/cm$^2$, wherein a ratio $\tau_1/\tau_2$ of the first pulse time ($\tau_1$) in proportion to the second pulse-time ($\tau_2$) is 0.5 at most, and wherein at least one of:

a peak current density of the high-power sputtering pulse is between 0.05 A/cm$^2$ and 5 A/cm, and a peak power of the high-power sputtering pulse is between 0.1 MW and 3 MW.

13. A high-power pulsed magnetron sputtering process, said process comprising:

producing within a process chamber via an electrical energy source, a sequence of complex discharge pulses to apply an electrical voltage (V) between an anode and a cathode in order to ionize a sputtering gas, wherein said cathode is a target comprising a material to be sputtered for coating on a substrate;

applying each complex discharge pulse for a complex pulse time ($\tau$), said complex discharge pulse comprising an electrical high-power sputtering pulse having a negative polarity with respect to the anode that is applied for a first pulse-time ($\tau_1$) followed by an electrical low-power charge cleaning pulse having a positive polarity with respect to the anode that is applied for a second pulse-time ($\tau_2$);

subsequent to the electrical low-power charge cleaning pulse and before another electrical high-power sputtering pulse is applied, switching off and/or setting to zero the electrical voltage (V) applied between the anode and the cathode for a third pulse-time ($\tau_3$), said third pulse-time ($\tau_3$) being greater than the first pulse-time ($\tau_1$) and less than the second pulse-time ($\tau_2$);

utilizing a peak voltage of the high-power sputtering pulse of between 800V and 2000V;

utilizing a peak power density of the high-power sputtering pulse of between 1 and 20 KW/cm²; and the coating on the substrate being a ceramic material, wherein a ratio $\tau_1/\tau_2$ of the first pulse-time ($\tau_1$) in proportion to the second pulse-time ($\tau_2$) is 0.5 at most, and wherein at least one of:

a peak current density of the high-power sputtering pulse is between 0.05 A/cm² and 5 A/cm², and a peak power of the high-power sputtering pulse is between 0.1 MW and 3 MW.

14. A process in accordance with claim 13, wherein during the third pulse-time ($\tau_3$) time is provided in order to relax into a starting state.

15. A process in accordance with claim 1, wherein during the third pulse-time ($\tau_3$) time is provided in order to relax into a starting state.

16. A process in accordance with claim 12, wherein the third pulse-time ($\tau_3$) is less than the second pulse-time ($\tau_2$).

\* \* \* \* \*